United States Patent [19]
Cline

[11] Patent Number: 4,652,777
[45] Date of Patent: Mar. 24, 1987

[54] CMOS PROGRAMMABLE LOGIC ARRAY

[76] Inventor: Ronald L. Cline, 15813 Poppy La., Monte Sereno, Calif. 95030

[21] Appl. No.: 683,289

[22] Filed: Dec. 18, 1984

[51] Int. Cl.[4] .................. H03K 19/094; H03K 19/173; H03K 19/003

[52] U.S. Cl. .................... 307/469; 307/443; 307/451; 307/303

[58] Field of Search ............... 307/443, 445, 448, 451, 307/468, 469, 481, 303, 449, 463, 202.1; 364/716

[56] References Cited

U.S. PATENT DOCUMENTS

| | | | |
|---|---|---|---|
| 3,943,377 | 3/1976 | Suzuki | 307/469 X |
| 3,943,551 | 3/1976 | Skorup | 307/451 X |
| 4,356,413 | 10/1982 | Rosenbluth et al. | 307/463 X |
| 4,499,387 | 2/1985 | Konishi | 307/451 X |

OTHER PUBLICATIONS

Bansal, "CMOS(N-Well) Master Image Chip"; *IBM-TDB*; vol. 26, No. 5, pp. 2404–2406; 10/1983.
Kraft et al, "Method of Personalizing Programmed Logic Arrays Using Multiple Levels of Polysilicon"; *IBM-TDB*; vol. 23, No. 3, pp. 881–882; 8/1980.

*Primary Examiner*—Larry N. Anagnos
*Attorney, Agent, or Firm*—Townsend & Townsend

[57] ABSTRACT

Large multi-input CMOS logic gates may be formed by a sequence of alternating CMOS NAND and NOR logic gates. The sequence of alternating gates may be compactly laid out in an integrated circuit to form arrays of functional AND or OR gates useful in PLAs. These arrays of CMOS gates consume low power and have response times suitable for integrated circuits.

12 Claims, 8 Drawing Figures

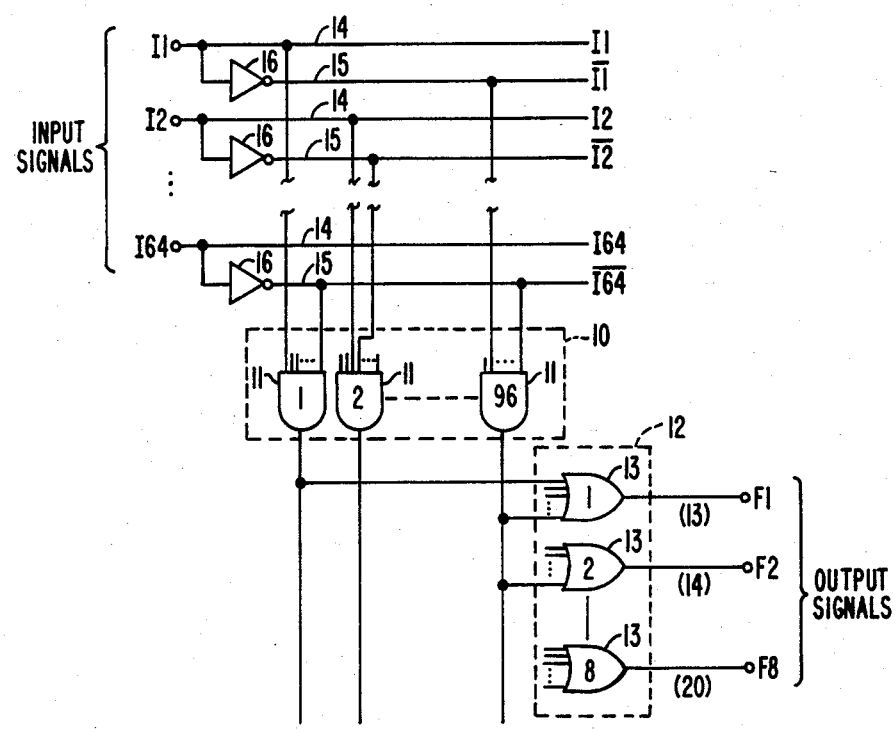
FIG._1.
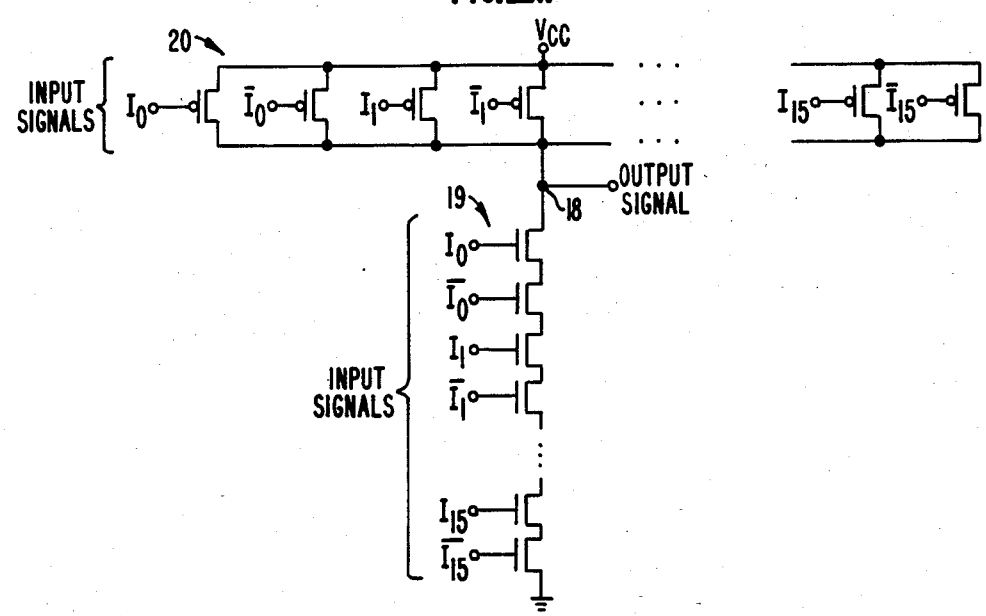
CMOS NAND GATE
FIG._2.

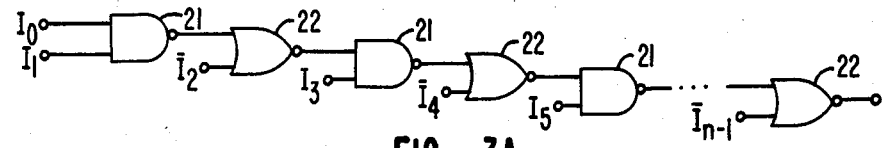
FIG._3A.
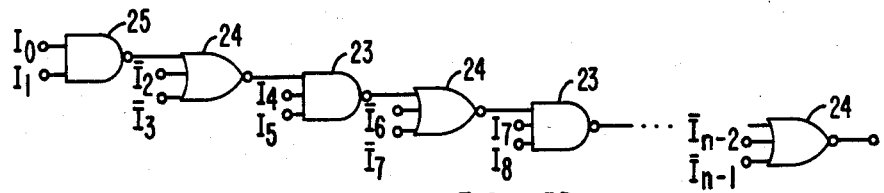
FIG._3B.
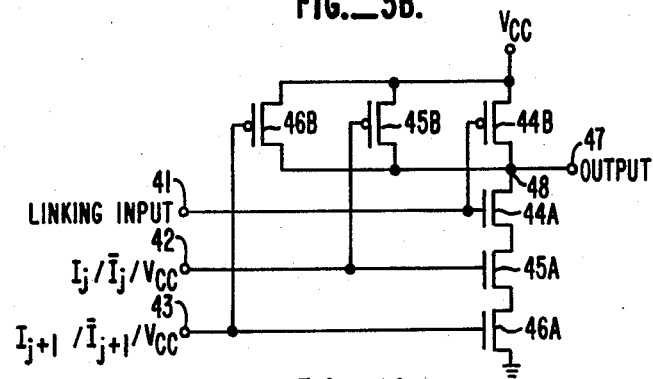
FIG._4A.
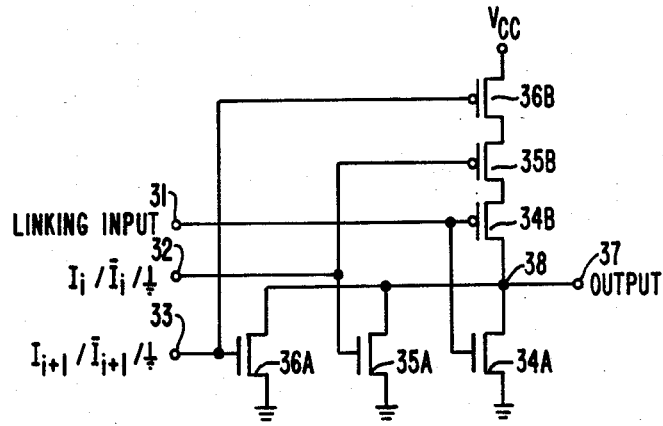
FIG._4B.

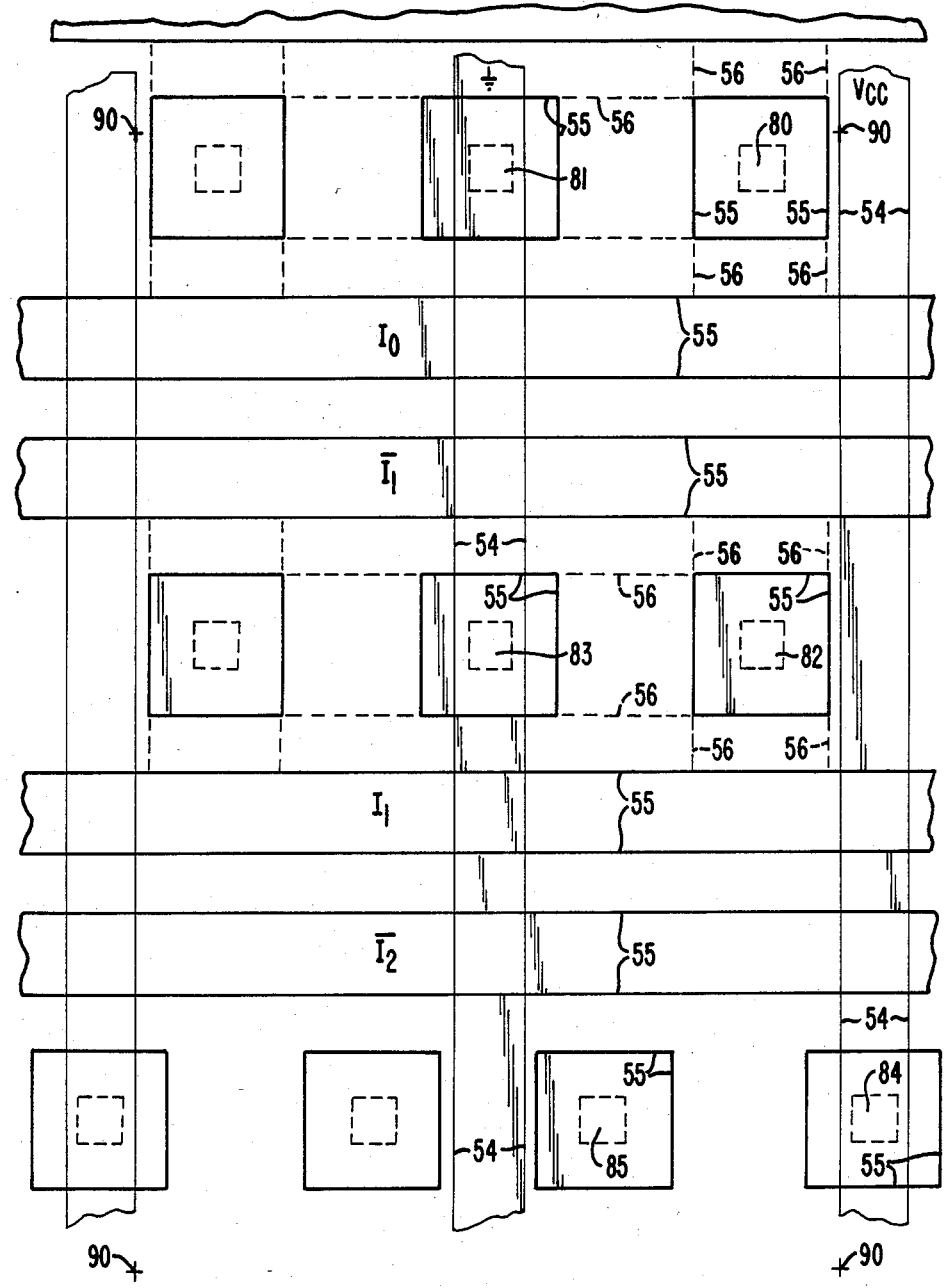
FIG._5A.

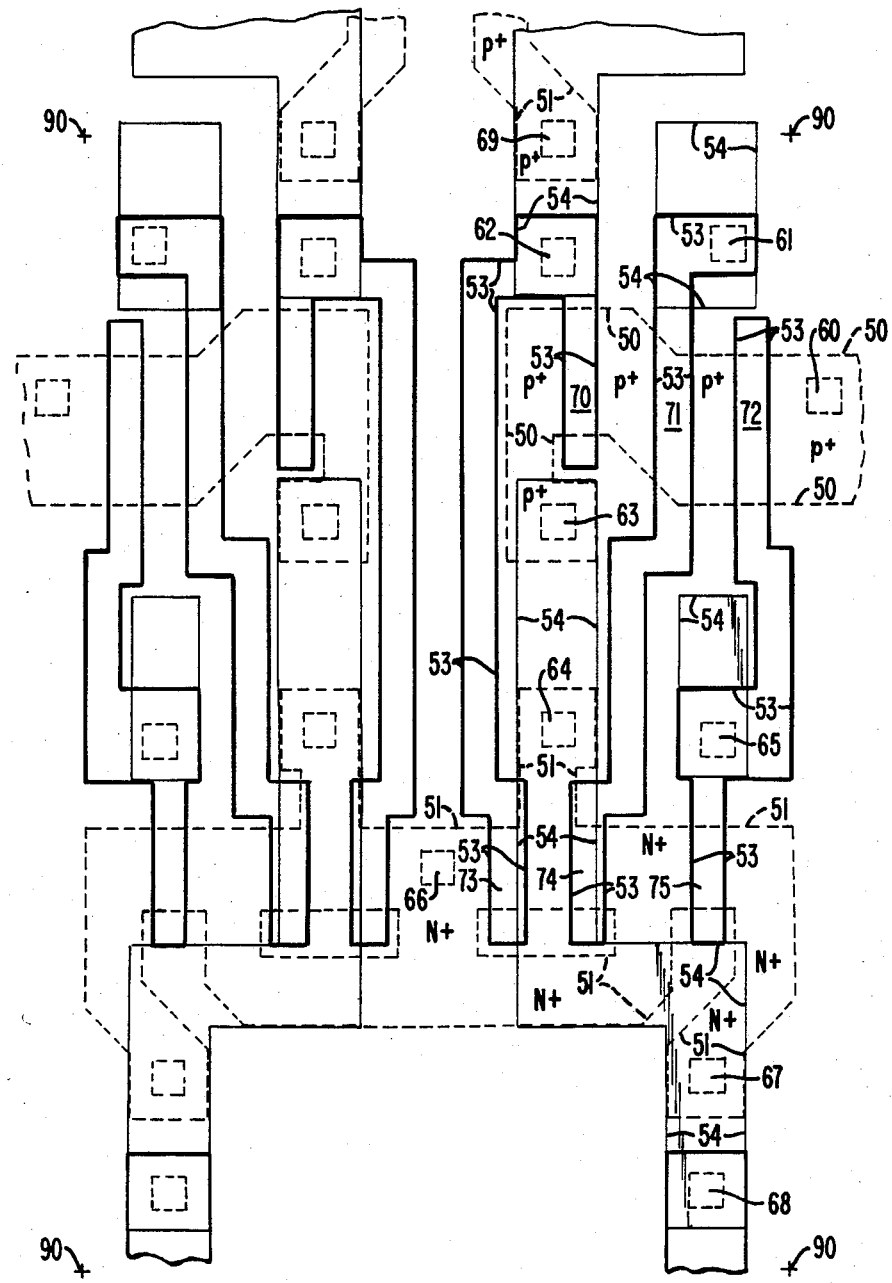
FIG._5B.

CMOS PROGRAMMABLE LOGIC ARRAY

FIELD OF THE INVENTION

The present invention relates to integrated circuits and, more particularly, programmable logic arrays (PLAs).

BACKGROUND OF THE INVENTION

Any logic function can be reduced to what is called the "sum of the products" of the input variables. Each product term is the logically ANDed combination of input variables. The "sum" of these product terms are the logically ORed combination of the product terms. Any logic function can be reduced to this form.

Based on the sum of products idea, programmable logic arrays (PLAs) are integrated circuit devices which permit a user to implement any logic function by programming an array of AND gates and an array of OR gates. The two arrays of AND and OR gates are coupled. The programming of the array of AND gates determines the product terms of the function; the programming of the array of OR gates selects which product terms will be ORed together.

FIG. 1 is a diagrammatic illustration of a typical PLA. The PLA has 64 input terminals which are connected to an array 10 of AND logic gates. The array 10 is, in turn, coupled to an array 12 of OR logic gates. Eight output terminals of the OR logic gate array 12 are the output terminals of the PLA. In the exemplary device of FIG. 1, each of the input terminals $I_1$–$I_{64}$ is coupled to a set of inverters 16 so that each input signal gives rise to true and complementary input signals. These input signals are carried on true and complementary input signal lines 14 and 15, respectively. Each of the true and complementary input signal lines is connectable to each of 96 AND gates 11, which form the array 10 of AND gates. Each AND gate 11 generates a product term of input variables $I_1$–$I_{64}$ and their complements. The particular variables selected for each product term are determined by the programming of the connections of the input signal lines 14, 15 to the AND gates 11, i.e., whether an AND gate 11 is connected to a particular signal line.

The output terminals of the AND gates 11 are each, in turn, connectable to an input terminal of each of the OR gates 13 of the array 12. Each connection of an input terminal of an OR gate 13 to an output terminal of an AND gate 11 is programmable. If no connection is made to a particular AND gate 11, then that particular product term is missing from the sum of products of the OR gate 13.

Thus, the output signal of each OR gate 13 is independently programmable. Each output function may be the sum of up to 96 product terms, each product term having up to 64 input variables, true and complementary. It should be noted that each of the AND gates 11 and OR gates 13 is a large multi-input logic gate, the AND gate 11 having up to 64 input terminals and the OR gate 13 having up to 96 input terminals.

A typical way of programming the PLA is the use of masks which make the programmable connections desired by the user of the PLA. The programming of the PLA is done by the manufacturer of the PLA according to the user's specifications. Another common form of programming PLAs is the use of fuses for the programmable connection. Fuses permit the user to program the PLA by "blowing" the fuse to disconnect the undesired input connections to the logic gates 11, 13. The remaining connections determine the output functions of the PLA.

A common semiconductor technology for PLAs is bipolar technology in which bipolar transistor circuits implement the PLA in an integrated circuit device. PLAs have been implemented in MOS technology also. MOS transistors of one polarity, such as N-channel or NMOS transistors, are used in the integrated circuit. Being smaller, MOS transistors permit more integration and complexity than do bipolar transistors at comparable costs. As in bipolar technology, MOS transistors act as passive load devices which allows a DC current path for the MOS PLA. While not as high as in a bipolar PLA, the MOS PLA still has fairly high power consumption.

A technology with very low power consumption is complementary MOS, or CMOS. In CMOS technology, a typical logic circuit has an output node located between a pair of active transistors of opposite channel polarity. Each gate of the transistor pair is connected to the same input signal so that a signal turning one transistor on, turns the other off. There is never a DC power path and power consumption is very low in CMOS circuits.

However, PLAs heretofore have not fully been implemented in CMOS technology. In prior art devices the input and output buffer circuits are typically true CMOS circuits, but the arrays of AND and OR gates remain single polarity MOS (typically NMOS) transistor circuits with passive loads discussed above.

An examination of a large multi-input CMOS logic gate reveals why the gate arrays remain in single polarity MOS, rather than complementary MOS (CMOS) technology. FIG. 2 shows a circuit diagram of a 16-input (actually 32-input, since each input signal has its complementary signal) CMOS NAND gate which would be used to implement an AND gate 11 in the array 10. The circuit in FIG. 2 has two groups of transistors, one group 19 of transistors with channels of one polarity and the second group 20 of transistors with channels of opposite polarity. Each transistor of one group is paired with a transistor in the second group so that the gates of the paired transistors receive the same input signal. To show that the transistors of the group 20 have channel regions of opposite polarity to that of the transistors in group 19, the transistors of group 20 have an additional circular symbol representing inversion with the normal symbol of an MOS transistor gate.

From this view of a CMOS NAND gate it can be appreciated that the problems of laying out such a circuit in the semiconductor substrate of an integrated circuit are difficult. Each pair of transistors in groups 19, 20 is connected together. Hence the large number of lines for layout in a large input CMOS logic gate becomes a problem. As the number of input lines increases, the problem correspondingly becomes more and more complicated.

A second problem is that the operational response time of the CMOS NAND gate shown in FIG. 2 is very slow. The string of transistors in group 19 has a very large resistance. Combined with the typical capacitance of such a circuit, the resistance-capacitance time constant of the circuit becomes large and the performance of the circuit is unacceptable.

A large multi-input CMOS NOR gate has the same problems. With these difficulties of layout and performance for a single large multi-input CMOS logic gate, the problem of designing an array of these logic gates for a PLA has prevented the creation of a completely CMOS PLA.

The present invention solves or substantially mitigates these problems. With the present invention, arrays of true CMOS AND and OR logic gates are possible. This permits PLAs with very low power consumption and acceptable response times.

SUMMARY OF THE INVENTION

The present invention provides for an integrated circuit comprising a plurality of CMOS NAND and NOR gates, each CMOS logic gate having at least two pairs of opposite polarity MOS transistors coupled about an output node between two voltage terminals, the gates of each transistor pair coupled to an input terminal, an input terminal of a CMOS NAND logic gate connected to an output node of a CMOS NOR logic gate and input terminal of a CMOS NOR logic gate connected to an output node of a CMOS NAND logic gate, whereby an alternating sequence of CMOS NAND and NOR gates is connected serially to operate as a multi-input AND or OR gate.

The present invention also provides for an integrated circuit PLA having an array of functional AND logic gates coupled to an array of functional OR logic gates, at least one of the arrays having its functional logic gates comprising a sequence of alternating CMOS NAND and NOR gates, whereby the array is implemented in CMOS.

Finally, the present invention provides for an integrated circuit PLA having an array of functional AND gates coupled to a logic array of functional OR gates, each functional AND and OR gate comprising a plurality of serially connected, alternating CMOS NAND and NOR gates, each NAND and NOR gate having at least one programmable input terminal, a matrix of input signal lines and fixed voltage lines over the CMOS NAND and NOR gates, whereby each NAND and NOR gate may be programmed by connecting the programmable input terminal to one of the matrix of lines.

BRIEF DESCRIPTION OF THE DRAWINGS

FIG. 1 is a block diagram of a typical programmable logic array (PLA).

FIG. 2 is a circuit diagram of a large multi-input CMOS NAND logic gate.

FIG. 3A shows a sequence of alternating CMOS two-input NAND and NOR gates of the present invention; FIG. 3B shows a sequence of alternating CMOS three-input NAND and NOR gates of the present invention.

FIG. 4A is a circuit diagram of a three-input CMOS NAND gate; FIG. 4B is a three-input CMOS NOR gate.

FIG. 5A is a top view of two layers of conducting lines over a semiconductor substrate having two adjacent CMOS OR gates according to the present invention; FIG. 5B is a top view of the underlying CMOS OR gates as laid out in a semiconductor substrate in the present invention.

DETAILED DESCRIPTION OF SPECIFIC EMBODIMENTS

FIG. 3A is one embodiment of the present invention. A sequence of alternating NAND gates 21 and NOR gates 22 is used in place of the large multi-input AND or OR gate discussed above. The sequence of alternating logic gates starts with a NAND gate followed by a NOR gate and so on. With the input signals to the NOR gates inverted, a sequence ending in a NOR gate is equivalent to a multi-input AND gate or a multi-input NOR gate with inverted input signals. A sequence ending in a NAND gate is equivalent to a multi-input NAND gate or an OR gate with inverted input signals.

The sequence of alternating NAND and NOR logic gates could start with a NOR gate. In that case, with the input signals to the NAND gates inverted, the sequence is equivalent to a multi-input OR gate or a multi-input NAND gate with input signals inverted if the sequence ends in a NAND gate. If the sequence ends in a NOR gate, the sequence is equivalent to a multi-input NOR gate or a multi-input AND gate with inverted input signals. All of these relationships follow from DeMorgan's Theorem.

The polarity of any signal can be changed simply by an inverter. For example, an inverter at the end of a sequence of alternating gates can change the equivalent multi-input NOR gate into an OR gate. Thus the present invention makes it possible to duplicate the logic function of any large multi-input AND or OR (and NAND or NOR) gate.

With the embodiment disclosed with reference to FIGS. 5A, B, the sequence starts with a NAND gate. The NAND gate is faster than the NOR gate since the series switching transistors of the NAND gate are NMOS transistors, which have an inherently faster switching speed than PMOS series switching transistors. In the CMOS NOR gate of FIGS. 5A, B the NOR gate has PMOS series switching transistors. By starting the sequence with a NAND gate, the response time of the sequence is desirably minimized.

In FIG. 3A only two-input NAND gates 21 and NOR gates 22 are used. Each logic gate 21, 22 has a certain amount of delay. In present day standard three micron CMOS technology, this delay should be approximately a few nanoseconds per logic gate. Thus, it is possible to use a long sequence of alternating NAND and NOR gates as a functional AND or OR gate, such as found in a PLA. The response of the sequence is still fast enough to be of practical use. Moreover, the sequence permits an array of an AND or OR gate using the present invention to be laid out very compactly with a grid of input signal lines and voltage supply lines. This is discussed later.

For the purposes of simplification, the logic gates 21, 22 are depicted as receiving N input signals $I_0$–$I_{N-1}$. Each logic gate 21, 22 has one input terminal which links that gate to a preceding logic gate in the alternating sequence. The other input terminal is an input signal terminal which is programmable. Each input signal terminal of a logic gate 21, 22 may be coupled to a line carrying an input signal or its complement or to a fixed voltage line so as to render the particular logic gate 21, 22 in a DON'T CARE state. In this state an input signal terminal is not responsive to an input signal or its complement. The functional logic gate represented by the sequence of alternating NAND and NOR gates is independent of the particular input signal. For a NAND gate 21 the DON'T CARE signal voltage is a logic one signal, while the DON'T CARE voltage signal for a NOR gate 22 is a logic zero signal.

FIG. 3B illustrates another embodiment of the invention using three-input NAND gates 23 with three-input NOR gates 24. Only the first NAND gate 25 which starts the sequence has two input terminals. A third input terminal is not needed since there is no prior NOR gate to link to.

For the same number of input signals, the embodiment of FIG. 3B shortens the sequence of alternating NAND and NOR gates 23, 24, while increasing the complexity of each particular logic gate. As the complexity of each logic gate increases, its response time necessarily slows. The exact amount the response time of a logic gate is increased by the addition of more input signal lines is highly technology dependent. A shorter sequence of alternating three-input CMOS NAND and NOR gates is not necessarily faster or slower than a longer sequence of two-input NAND and NOR gates. That determination must be made on a case-by-case basis.

The present invention may also be implemented with four-input CMOS NAND and NOR gates. However, beyond this number, the complexity of laying out the signal lines and the increase in response time becomes evident so that a sequence of alternating NAND and NOR gates with more than four input lines to each logic gate is considered impractical.

The particular embodiment which follows is the three-input NAND and NOR gate. However, many of the comments are applicable to two-input and four-input CMOS NAND and NOR gates.

FIGS. 4A and 4B show respectively a three-input CMOS NAND gate and a three-input CMOS NOR gate in a sequence of alternating NAND and NOR gates which permits the easy implementation of a large multi-input NAND or OR gate useful in PLAs.

The CMOS NAND gate in FIG. 4A has pairs of transistors having opposing polarity 44A,B; 45A,B; and 46A,B connected between a power supply terminal at voltage $V_{CC}$ (typically +5 volts) and a second power supply terminal at ground. Coupled between each pair of transistors is a circuit node 48 which is connected to an output terminal 47. Each pair of transistors has its gates connected to input terminals 41, 42 and 43. The transistors 44A, 45A and 46A are connected in series between the node 48 and ground. On the other hand, the complementary transistors 44B, 45B, and 46B are connected in parallel between the power supply terminal at $V_{CC}$ and the node 48.

The input terminal 41 which is connected to the gates of the transistor pair 44A,B most closely coupled to the node 48 is linked to the output terminal of the CMOS NOR gate which precedes it in the alternating sequence. Similarly the output terminal 47 is linked to the input terminal connected to the gates of the transistor pair most closely coupled to the node of the seucceding NOR gate. This arrangement increases the response time of the sequence by increasing the speed at which signals can ripple through the sequence of logic gate.

The input terminals 42, 43 may be coupled to receive arbitrary input signals $I_j$, $I_{j+1}$ or their complements $\bar{I}_j$ and $\bar{I}_{j+1}$. To render a transistor pair into a DON'T CARE state, the input signal terminals 42, 43 may also be connected to a source of voltage for a logic one. In this embodiment this voltage source is the voltage supply terminal at $V_{CC}$.

Similarly, in the CMOS NOR gate of FIG. 4B, pairs of transistors 34A,B; 35A,B; and 36A,B are connected between two voltage sources at $V_{CC}$ and ground. A circuit node 38 connected to an output terminal 37 is coupled between these transistor pairs. Since the illustrated gate is a NOR gate, the transistors 34A, 35A, and 36A are connected in parallel between the node 38 and ground. The complementary transistors 34B, 35B, and 36B, on the other hand, are connected in series between the node 38 and the power terminal at $V_{CC}$.

Each of the transistor pairs have their gates connected together to a single input terminal. The transistor pair 34A,B have their gates connected to the input terminal 31; the transistor pair 35A,B have their gates connected to the terminal 32; and the transistor pair 36A,B have their gates connected to the input terminal 33. The input terminal 31 of the transistor pair 34A,B, which is most closely coupled to the node 38, is linked to the output terminal of the preceding CMOS NAND gate. Similarly the output terminal 37 is linked to the input gate of the transistor pair of the succeeding NAND gate. This arrangement facilitates the response time of the logic gate sequence as discussed previously.

The other two input terminals 32, 33 may be coupled to receive input signals $I_i$ (or its complement) and $I_{i+1}$ (or its complement), respectively. Additionally, the input signal terminals 32, 33 may be connected to a voltage source of logic 0 state, here ground, which renders that input terminal into a DON'T CARE state.

Thus, the sequence of alternating CMOS NAND and NOR gates may be formed with each gate having three input terminals, one linking input terminal and two input signal terminals.

The elegance by which the logic gate sequence of the present invention may be laid out is illustrated in FIGS. 5A and 5B. The techniques used to manufacture the present invention described herein are well known to those versed in the semiconductor processing technology.

FIG. 5B shows the mask layout of two adjacent three-input CMOS NOR gates. The following discussion refers mostly to the NOR gate on the right side of FIG. 5B. Lines 50 show the outline of the source-drain diffusion region into the silicon substrate of the integrated circuit. The gate is a NOR logic gate and this source-drain region is a heavily positively doped (P+) region. Lines 51 delineate another source-drain region in the substrate; this region is a heavily negatively doped (N+) region. Over the substrate is a layer of polysilicon which masks outline shown by lines 53. Over the polysilicon layer is a first metal layer which is shown by lines 54.

In FIG. 5B only part of the first metal layer is shown. The other portions of the first metal, or metal 1, layer is illustrated in FIG. 5A. Contact regions 60–69 show the locations where the metal 1 layer contacts the silicon substrate in the P+ and N+ regions or where the metal 1 layer contacts the polysilicon layer. For example, the contact area 60 is connected to a metal line at $V_{CC}$.

P-channel, or PMOS, transistors are formed by the P+ region outlined by the lines 50 with the polysilicon layer delineated by the lines 53 forming the gate electrodes of the MOS transistors. Region 70, 71 and 72 show the gate regions of the three PMOS transistors which are connected in series.

Similarly, the N+ region outlined by the lines 51 and the polysilicon layer outlined by the lines 53 form N-channel, or NMOS, transistors. Part of the source-drain region outlined by the lines 51 is connected to ground through a contact region 66. Reference numeral 73, 74, and 75 show the channel regions under the polysilicon electrodes of the NMOS transistors.

Through a contact area 62, a linking input terminal of the CMOS NOR gate is coupled by the metal 1 layer to the output terminal of the preceding CMOS NAND gate. The contact area 62 provides the connection for the output signal of the preceding CMOS NAND gate to the gate electrodes of the PMOS transistor having channel region 70 and the NMOS transistor having channel region 73. It should be noted that these two transistors are most closely coupled to the contact region 63 from which the output signal of the NOR gate is transmitted through a metal 1 layer to the succeeding CMOS NAND gate through the contact region 68. As illustrated, the sequence of alternating CMOS NAND and NOR gates is in a vertical direction.

To obtain the succeeding CMOS NAND gate, the same circuit layout is used but the polarities of the source-drain regions outlined by the lines 50 and 51 are reversed. The layout is also inverted about a centered vertical axis through the layout so that the contact region corresponding to region 60 is on the left side under and in contact with the vertical metal 1 line at ground. The region corresponding to contact region 66 is on the right under and in contact with the vertical metal 1 line at $V_{CC}$. In other words, the NAND gate appears like the NOR gate on the left side of FIG. 5B, except that the polarities of the source-drain regions are reversed.

FIG. 5B also shows parts of the neighboring logic circuit layouts as it might be used in an array. It can be seen that the embodiment shown in FIGS. 5B (and 5A) are highly suitable for a logic array layout.

FIG. 5A shows part of the metal 1 layer and the complete metal 2 layer portions which lie over the substrate and delineated polysilicon layer. Reference marks 90 in both FIGS. 5A and 5B show the exact relationship and location of the masks defined in the two drawings with respect to each other.

In FIG. 5A the metal regions are outlined by lines 54 and 55. Lines 54 show the bottom metal 1 layer, while lines 55 show the top metal 2 layer. The metal 2 lines are horizontal and carry arbitrary input signals $I_n$. The metal 2 layer also makes contact to the metal 1 layer below. Contact areas 80–84 show the location of these contact areas which may be programmed to be connected to different parts of the top metal 2 layer.

For example, the contact areas 80 and 82 are connected to the input signal terminals of the NOR gate lying below. The contact area 80 is connected to the gate electrodes of the PMOS transistor having the channel region 71 and the NMOS transistor having the channel region 74. The contact region 72 is connected to the PMOS transistor having the channel region 72 and the NMOS transistor having the channel region 75. These contact regions may be programmed by selecting to which metal lines these contact regions are to be connected. Lines 56 show these optional connections. For example, the contact region 82 may be connected to the metal 2 layer bearing an $I_n$ input signal, or be connected to the metal 2 line above bearing the complement $\bar{I}_n$ input signal. Additionally, the contact area 82 may be connected to the vertical metal 1 layer at the left through the contact area 83. This metal 1 line is at a fixed voltage, ground, to render that input terminal into a DON'T CARE state.

Thus the sequence of alternating NAND and NOR logic gates is programmed in one of the final steps in the manufacture of the integrated circuit. A PLA according to the present invention is programmed when the top metal 2 layer is delineated into the desired pattern. This is desirable since it permits a PLA manufacturer to process semiconductor wafers almost to completion including the deposition of the metal 2 layer. The wafers may be stored and, upon a customer's specifications, may be quickly programmed by delineating the metal 2 layer into the desired pattern. The time between a customer's request for a PLA and the delivery of the programmed part is minimized.

As can be seen in FIGS. 5A and 5B, the present invention has a matrix of conduction lines over a semiconductor substrate which bears CMOS logic gates. The matrix has vertical metal 1 lines at fixed voltages, ground and $V_{CC}$, and horizontal metal 2 lines carrying true and complementary input signals to form a grid. Within each rectangular grid element there is a contact area as an input signal terminal to the CMOS logic gate below. The input signal terminal may be simply programmed by the delineation of the topmost metal layer of the integrated circuit. This physical association between grid elements and input terminals is also possible with two-input and four-input CMOS logic gates.

Thus the present invention provides for the implementation of arrays of CMOS AND and OR gates. For a PLA the present invention may be used for one or both arrays. For example, a PLA having eight output functions, each output function having up to 48 product terms with each product term having up to 16 true or complementary input signals, may be designed by utilizing the present invention for the functional array of AND gates. Each of the 48 sequences of alternating CMOS logic gates is connectable up to 32 true and complementary input signals.

On the other hand, the functional array of OR gates is best implemented by more conventional means. Each of the eight output function terminals is coupled to three levels of CMOS NOR and NAND gates which receive the product terms in parallel. A first level of twelve NOR gates receives the 48 product terms signals (each NOR gate connectable to four product terms). A second level of three NAND gates receives the signals from the NOR gates, a NOR gate with an inverter at its output terminal combines the output signals of the three NAND gates. This is a conventional logic tree structure.

While not as compact as a layout of eight sequences of alternating NAND and NOR gates according to the present invention, the conventional logic tree structure is suitable for the function array of OR gates in the PLA. Since the incoming signals are processed in parallel, the response time of the conventional array is faster than the longer sequence of alternating logic gates of this invention. If three-input logic gates are used, then a sequence would provide a response of some 24 serially connected gates. The conventional layout has a response of three serially connected gates.

One can balance performance and layout considerations by mixing conventional logic design with the present invention to obtain the best results.

Therefore, although the foregoing invention has been described in detail by way of illustration and example for purposes of clarity of understanding, it is obvious that certain changes and modifications may be practiced within the scope of the appended claims.

What is claimed is:

1. An integrated circuit programmable logic array (PLA) having an array of functional AND gates coupled to an array of functional OR gates, at least one of said arrays comprising sequences of alternating CMOS NAND and NOR gates connected serially, each CMOS NAND and NOR gate having not more than four input terminals, at least one input terminal being programmable, whereby the functional AND gates or the functional OR gate of said one array are implemented in CMOS.

2. A PLA as in claim 1 wherein said each of said CMOS NAND and NOR logic gates comprises an output terminal connected to a circuit node coupled between pairs of MOS transistors of opposite channel polarity, gates of each pair of MOS transistors connected together and coupled to an input terminal, an output terminal of the logic gate in the sequence of alternating CMOS NAND and NOR gates coupled to input terminal to the pair of transistors closest to said circuit node.

3. A PLA as in claim 2 wherein each of said CMOS NAND and NOR logic gates has two input terminals of which one input terminal is programmable.

4. A PLA as in claim 2 wherein each of said CMOS NAND and NOR logic gates has three input terminals of which two input terminals are programmable.

5. A PLA as in claim 2 wherein at least one of said sequences of alternating CMOS NAND and NOR gates is rendered inoperative by connecting an input terminal of a NAND gate of said sequence to a logic ZERO voltage source or by connecting an input terminal of a NOR gate of said sequence to a logic ONE voltage source.

6. A PLA as in claim 2 wherein a programmable input terminal of a NAND gate is placed in a DON'T CARE state by connecting said input terminal to a logic ONE voltage source.

7. A PLA as in claim 2 wherein a programmable input terminal of a NOR gate is placdd in a DON'T CARE state by connecting said input terminal to a logic ZERO voltage source.

8. An integrated circuit programmable logic array (PLA) having a logic array of functional AND gates coupled to a logic array of functional OR gates, each functional AND and OR gate comprising
a plurality of serially connected, alternating CMOS NAND and NOR gates, each NAND and NOR gate having not more than four input terminals, at least one input terminal being programmable, and
a matrix of input signal lines and fixed voltage lines over said CMOS NAND and NOR gates whereby each NAND and NOR gate may be programmed by connecting said programmable input terminal to one of said matrix of lines.

9. A PLA as in claim 8 wherein said matrix of input signal lines and fixed voltage lines comprise two layers of conducting lines overlying said CMOS NAND and NOR gates, said NAND and NOR gates programmed by the definition of the topmost layer of said conducting lines.

10. An integrated circuit comprising a plurality of CMOS NAND and NOR logic gates,
each CMOS logic gate having at least two pairs, but not more than four pairs, of opposite polarity MOS transistors coupled about the output node between two voltage source terminals, the gates of each transistor pair coupled to an input terminal, an input terminal of a CMOS NAND logic gate connected to an output node of a CMOS NOR logic gate and an input terminal of a CMOS NOR logic gate connected to an output node of a CMOS NAND logic gate, each input terminal of said CMOS logic gates not connected to a preceding CMOS logic gate being an input signal terminal for receiving input signals; and
a matrix of input signal lines and fixed voltage lines overlying said CMOS logic gates, each CMOS logic gate capable of being programmed by connecting said logic gate input signal terminals to one of said matrix lines.

11. An integrated circuit as in claim 10 wherein said matrix of lines is arranged in a grid having said input signal lines running in a first direction and said fixed voltage lines running in a second direction perpendicular to said first direction, said transistor of each CMOS logic gate arranged so that each input signal terminal of said logic gate is physically associated with a grid element of matrix lines in a one-to-one relationship.

12. An integrated circuit as in claim 11 wherein said input signal lines comprises a first layer of conducting lines and said fixed voltage lines comprises a second layer of conducting lines, said CMOS logic gates programmed upon the delineation of the topmost layer of said two conducting lines.

* * * * *